(12) United States Patent
Atou (10) Patent No.: US 6,633,002 B2
(45) Date of Patent: *Oct. 14, 2003

(54) TAPE CARRIER HAVING HIGH FLEXIBILITY WITH HIGH DENSITY WIRING PATTERNS

(75) Inventor: Noriaki Atou, Tokyo (JP)

(73) Assignee: NEC LCD Technologies, Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/575,092

(22) Filed: May 19, 2000

(65) Prior Publication Data

US 2002/0157857 A1 Oct. 31, 2002

(30) Foreign Application Priority Data

May 20, 1999 (JP) .............................. 11-139963

(51) Int. Cl.⁷ .............................. H01B 7/00; H05K 1/03
(52) U.S. Cl. .............................. 174/117 F; 174/117 FF; 174/255
(58) Field of Search ............... 174/117 F, 117 FF, 174/254, 260, 255; 349/12; 361/748, 749–751

(56) References Cited

U.S. PATENT DOCUMENTS

| | | | | | |
|---|---|---|---|---|---|
| 5,600,460 A | * | 2/1997 | Yamamoto et al. | ........... | 349/54 |
| 5,684,550 A | * | 11/1997 | Shibata et al. | ........... | 349/62 |
| 5,726,491 A | * | 3/1998 | Tajima et al. | ........... | 257/668 |
| 5,744,859 A | * | 4/1998 | Ouchida | ........... | 257/668 |
| 5,897,188 A | * | 4/1999 | Sasuga et al. | ........... | 349/150 |
| 5,907,375 A | * | 5/1999 | Nishikawa et al. | ........... | 349/12 |
| 6,084,291 A | * | 7/2000 | Fujimori | ........... | 257/668 |
| 6,195,148 B1 | * | 2/2001 | Sasuga et al. | ........... | 349/149 |
| 6,225,568 B1 | * | 5/2001 | Lin et al. | ........... | 174/250 |
| 6,372,996 B2 | * | 4/2002 | Lin et al. | ........... | 174/250 |
| 6,555,755 B1 | * | 4/2003 | Yanagisawa | ........... | 174/254 |

FOREIGN PATENT DOCUMENTS

| | | | | |
|---|---|---|---|---|
| JP | 63-162464 | 10/1988 | | |
| JP | 0432148 A | * 11/1992 | ........... | H01L/21/60 |
| JP | 4-342148 | 11/1992 | | |
| JP | 6-5661 | 1/1994 | | |
| JP | 7-288266 | 10/1995 | | |
| JP | 8-306741 | 11/1996 | | |
| JP | 08-306741 | 11/1996 | | |
| JP | 10-289930 | 10/1998 | | |
| JP | 10-335377 | 12/1998 | | |

* cited by examiner

Primary Examiner—William H. Mayo, III
(74) Attorney, Agent, or Firm—Scully, Scott, Murphy & Presser (57) ABSTRACT

A tape carrier with high density wiring patterns and having high flexibility, a tape carrier package using such tape carrier, and a method of manufacturing them. The tape carrier has a base film made of an insulating material and having wiring patterns formed thereon. The tape carrier also has a bending area for bending the tape carrier therein. In the bending hole region, a plurality of round holes are formed regularly. Diameter of each of the holes is larger than a space between the wiring patterns in the bending area. Preferably, the centers of the holes are located at grid points of an assumed predetermined grid and at the intersections of diagonal lines connecting the grid points. Also, the center of each of the plurality of holes is located on the center line of a space between adjacent wiring patterns in the bending area.

20 Claims, 5 Drawing Sheets

PRIOR ART

FIG. 5

PRIOR ART

TAPE CARRIER HAVING HIGH FLEXIBILITY WITH HIGH DENSITY WIRING PATTERNS

BACKGROUND OF THE INVENTION

1. Field of the Invention

The present invention relates generally to a tape carrier in which wiring patterns are formed on an insulating base film, and a method of manufacturing such a tape carrier. More particularly, the present invention relates to a tapes carrier with high density wiring patterns which is bent easily and which has a high reliability, and a method of manufacturing such a tape carrier. The present invention also relates to a tape carrier package (TCP) which is fabricated by attaching a semiconductor chip on such tape carrier, and a liquid crystal display device having such a TCP.

2. Description of the Related Art

A tape carrier package (TCP) used in a liquid crystal display and the like is often used in condition it is bent or folded at predetermined portion or portions thereof. Conventionally, TCP's having various structures are used to obtain good bending characteristics such as easiness of bending and the like.

Figure 4:
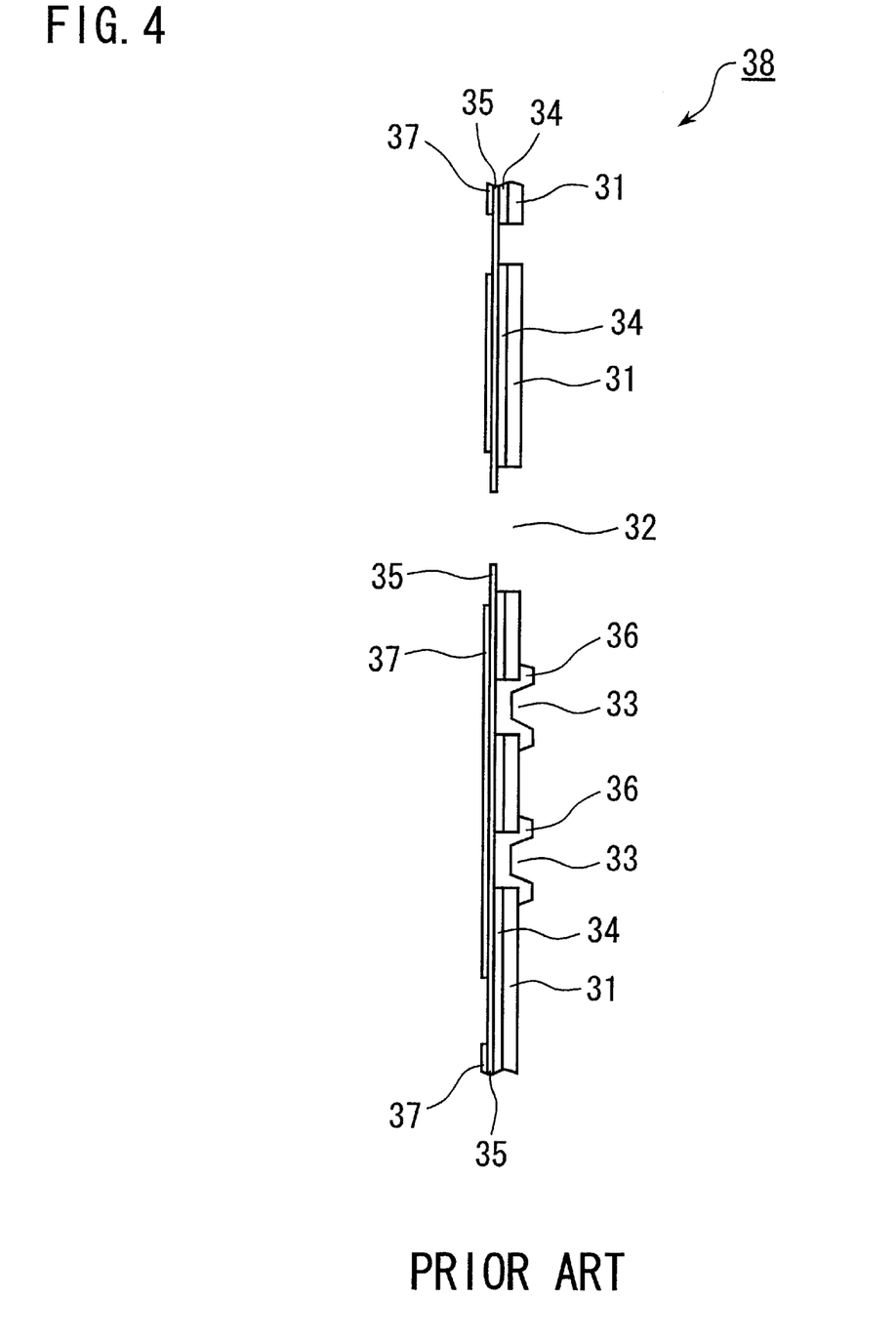
FIG. 4 is a schematic cross sectional view illustrating a conventional tape carrier.

For example, there is known a tape carrier structure disclosed in Japanese patent laid-open publication No. 7-28866. FIG. 4 is a cross sectional view showing schematically the tape carrier structure disclosed in Japanese patent laid-open publication No. 7-28866. The tape carrier shown in FIG. 4 comprises an insulating base film 31, and a wiring pattern portion 35 bonded to the insulating base film 31 with glue 34. On the wiring pattern portion 35, there is formed a solder resist layer or film 37. Also, a device hole 32 for mounting a semiconductor device is formed in the base film 31. Further, slits 33 are formed in the base film 31 along bending portions thereof. By forming such slits 33, it becomes possible to easily bend the tape carrier 38 along the slits 33. Further, in order to protect the wiring pattern portion 35 exposed via the slits 33, and to avoid disconnection or break of the wiring pattern portion 35, a protective resin film 36 made of polyimide and the like is formed on portions of the wiring pattern portion 35 exposed via the slits 33.

Figure 5:
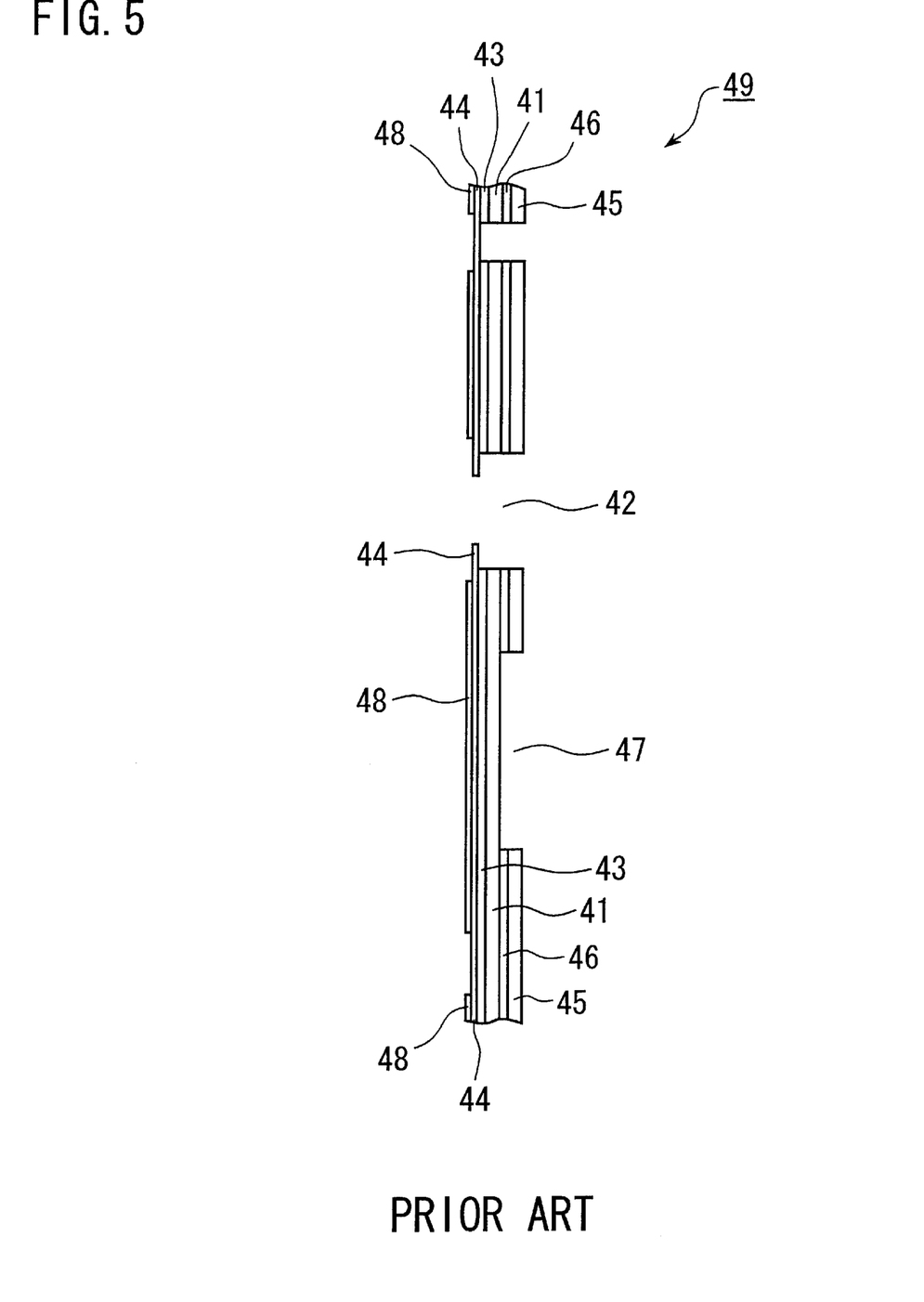
FIG. 5 is a schematic cross sectional view illustrating another conventional tape carrier.

There is also known a tape carrier structure disclosed in Japanese patent laid-open publication No. 8-306741. FIG. 5 is a cross sectional view showing schematically the tape carrier structure disclosed in Japanese patent laid-open publication No. 8-306741. The tape carrier of FIG. 5 comprises an insulating base film 41 made of flexible and soft material, and a wiring pattern portion 44 bonded on the base film 41 with glue 43. A surface of the wiring pattern portion 44 opposite to the base film 41 is coated with a solder resist layer 48. Also, in the base film 41, a device hole 42 is formed for mounting a semiconductor device. In this structure, no slit is formed in the base film 41 to facilitate bending of the base film 41. However, a film for reinforcement 45 which is somewhat rigid and which has a slit 47 is bonded onto the base film 41 with glue 46 on the surface opposite to the wiring pattern portion 44. Thereby, the tape carrier 49 can be easily foldable along the slit 47.

However, in the structure described in Japanese patent laid-open publication No. 7-28866 and shown in FIG. 4, it is necessary to apply the protective resin film 36 of polyimide onto the portions of the wiring pattern portion 35 exposed via the slit 33. Therefore, process steps for manufacturing such a tape carrier become complicated, and throughput of manufacturing is also deteriorated.

In the structure described in Japanese patent laid-open publication No. 8-306741 and shown in FIG. 5, it is necessary to use the film 45 for reinforcement in addition to the base film 41. Thus, it needs many kinds of materials used for fabricating such tape carrier, and it results in increase of the cost.

Further, in the tape carrier structure disclosed in Japanese patent laid-open publication No. 4-342148, wiring patterns made of copper (Cu) foil which is plated with tin (Sn) are formed on an upper surface of a base film which is a plastic film made of polyimide, polyester or the like. In a bending region of the base film, slit shaped openings for bending are formed by wet etching. The slit shaped openings are parallel with the wiring patterns respectively and are formed between adjacent wiring patterns such that wiring patterns are not exposed via the slit shaped openings. Each of the slit shaped openings has a width of 60 μm (micrometers) and a length of 4 mm, and has a tapered cross section which becomes wider toward the bottom side of the base film at an angle of 30–60 degrees. The slit shaped openings are formed at a pitch of 200 μm.

In the tape carrier described in Japanese patent laid-open publication No. 4-342148, elongated slit shaped openings are formed parallel with the wiring patterns and formed between the wiring patterns throughout the bending area. Therefore, when the tape carrier is bent or a stress is applied to the tape carrier from the outside, the stress is concentrated at portions near end portions of the slit shaped openings so that there is a possibility that the base film is damaged. In order to avoid such disadvantage, it is necessary to increase the thickness of the base film to enhance the strength thereof. However, when the thickness of the base film is increased, it becomes difficult to bend the tape carrier, and it results in increase of weight and the cost of the tape carrier.

In Japanese patent laid-open publication No. 4-342148, another structure of a tape carrier is disclosed in which many and small round openings are formed by wet etching in a bending area of a base film on which wiring patterns are formed. Each of the round openings is formed between the wiring patterns such that the wiring patterns are not exposed via the round openings.

However, in this structure, since the round openings are formed between adjacent wiring patterns, when respective spaces between adjacent wiring patterns are small, it is difficult to form appropriately the round openings in the base film such that sufficient flexibility of the base film is obtained. Therefore, it is not appropriate to use this structure when spaces between wiring patterns are small. Recently, it is required that wiring patterns are formed in high density on a base film of a tape carrier, so that spaces between the wiring patterns on the base film must be very small. Thus, this structure does not suit such recent tape carrier in which wiring patterns are formed in high density.

Also, in this structure, since small round openings are formed between respective wiring patterns, it is impossible to enlarge the proportion of areas of openings in the bending area of the tape carrier sufficiently. Therefore, it is impossible to obtain good bending characteristics, such as sufficient flexibility at desired portion or portions of a tape carrier.

SUMMARY OF THE INVENTION

Therefore, it is an object of the present invention to obviate the above-mentioned disadvantages of the prior art.

It is another object of the present invention to provide: a tape carrier which has a simple structure, improved bending characteristics and high mechanical strength; a method of manufacturing such a tape carrier; a TCP using such a tape carrier; and a liquid crystal display device comprising such a TCP.

It is still another object of the present invention to provide: a tape carrier which can be bent easily and appropriately at a desired bending region; a method of manufacturing such a tape carrier; a TCP using such a tape carrier; and a liquid crystal display device comprising such a TCP.

It is still another object of the present invention to provide: a tape carrier which can be manufactured at low cost and which can be bent easily and appropriately at a desired bending region; a method of manufacturing such a tape carrier; a TCP using such a tape carrier; and a liquid crystal display device comprising such a TCP.

It is still another object of the present invention to provide at low cost: a tape carrier which can be bent easily and appropriately at a desired bending region without deteriorating the mechanical strength; a method of manufacturing such a tape carrier; a TCP using such a tape carrier; and a liquid crystal display device comprising such a TCP.

It is still another object of the present invention to provide at low cost: a tape carrier in which wiring patterns can be formed at high density on a base film and which can be bent easily and appropriately at a desired bending region; a method of manufacturing such a tape carrier; a TCP using such a tape carrier; and a liquid crystal display device comprising such a TCP.

According to an aspect of the present invention, there is provided a tape carrier comprising: a base film made of an insulating material; wiring patterns formed on the base film; and a bending area of the base film in which a plurality of holes are formed regularly, the width of each of the holes in the direction perpendicular to the wiring patterns being larger than a space between the wiring patterns in the bending area.

In this case, it is preferable that each of the plurality of holes has a round shape.

It is also preferable that the holes are formed such that the centers of the holes are located at grid points of an assumed grid structure which is composed of lines parallel with the wiring patterns and lines perpendicular to the wiring patterns and at the intersections of diagonal lines connecting the grid points.

It is further preferable that the distance between adjacent grid points is four times a pitch of the wiring patterns in the bending area.

It is advantageous that the center of each of the plurality of holes is located on the center line of a space between adjacent wiring patterns in the bending area.

According to another aspect of the present invention, there is provided a tape carrier package comprising: a base film made of an insulating material; wiring patterns formed on the base film; one or more semiconductor device each mounted on or in a device hole formed at the base film; and a bending area of the base film in which a plurality of holes are formed regularly, the width of each of the holes in the direction perpendicular to the wiring patterns being larger than a space between the wiring patterns in the bending area.

In this case, it is preferable that each of the plurality of holes has a round shape.

It is also preferable that the holes are formed such that the centers of the holes are located at grid points of an assumed grid structure which is composed of lines parallel with the wiring patterns and lines perpendicular to the wiring patterns and at the intersections of diagonal lines connecting the grid points.

It is further preferable that the distance between adjacent grid points is four times a pitch of the wiring patterns in the bending area.

It is advantageous that the center of each of the plurality of holes is located on the center line of a space between adjacent wiring patterns in the bending area.

According to still another aspect of the present invention, there is provided a liquid crystal display device which comprises a tape carrier package as mentioned above.

According to still another aspect of the present invention, there is provided a method of manufacturing a tape carrier, the method comprising: preparing a base film made of an insulating material; forming a plurality of holes regularly in a bending area of the base film; and forming wiring patterns on a surface of the base film; wherein the width of each of the holes in the direction perpendicular to the wiring patterns being larger than a space between the wiring patterns in the bending area.

In this case, it is preferable that the method of manufacturing a tape carrier further comprises: forming sprocket holes and at least one device holes each for mounting a semiconductor device therein or thereon in the base film.

It is also preferable that the forming a plurality of holes regularly in a bending area of the base film and the forming sprocket holes and at least one device holes each for mounting a semiconductor device therein or thereon in the base film are performed in substantially the same process step.

It is further preferable that, in the forming a plurality of holes regularly in a bending area of the base film, the holes are formed by punching which uses metallic die.

It is advantageous that, in the forming a plurality of holes regularly in a bending area of the base film, the holes are formed by etching.

It is also advantageous that each of the plurality of holes has a round shape.

It is further advantageous that the holes are formed such that the centers of the holes are located at grid points of an assumed grid structure which is composed of lines parallel with the wiring patterns and lines perpendicular to the wiring patterns and at the intersections of diagonal lines connecting the grid points.

It is preferable that the distance between adjacent grid points is four times a pitch of the wiring patterns in the bending area.

It is also preferable that the center of each of the plurality of holes is located on the center line of a space between adjacent wiring patterns in the bending area.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DETAILED DESCRIPTION OF EXEMPLARY EMBODIMENTS

With reference to the drawings, an embodiment of the present invention will now be explained in detail.

Figure 1:
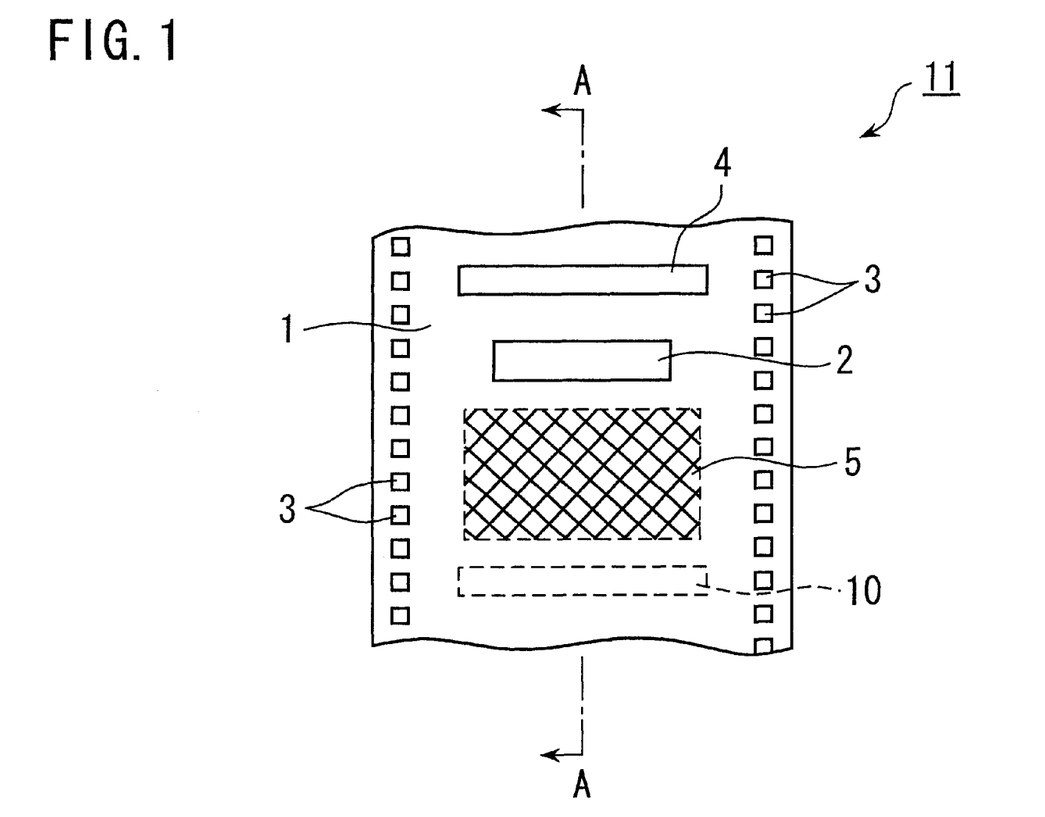
FIG. 1 is a partial plan view schematically illustrating a tape carrier according to an embodiment of the present invention.
Figure 2:
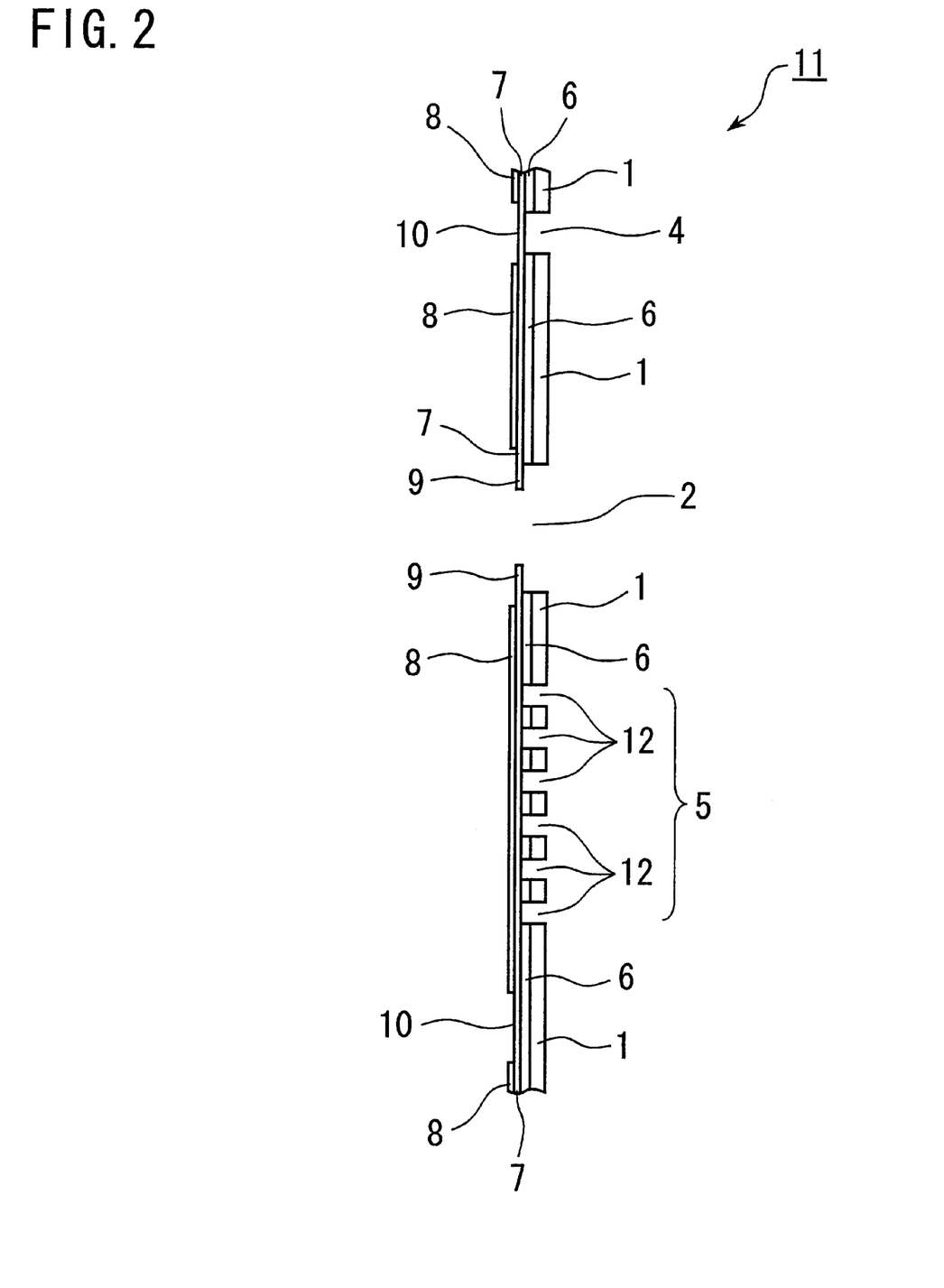
FIG. 2 is a schematic cross sectional view taken on line A—A of FIG. 1.

FIG. 1 is a plan view schematically showing a tape carrier according to an embodiment of the present invention. FIG. 2 is a schematic cross sectional view taken on line A—A of FIG. 1.

The tape carrier according to the present invention is a tape carrier for constituting, for example, a tape carrier package (TCP). The TCP is used, for example, in a liquid crystal display and the like.

The tape carrier shown in FIG. 1 and FIG. 2 comprises an insulating base film 1 having a tape like shape. The base film 1 is fabricated from a polymer or resin film having high flexibility, for example, a polyimide film having a thickness of 75 $\mu$m (micrometers) such as UPILEX-S® (Poly [1,1',3,3'-tetrahydro-1,1',3,3'-tetraoxo[5,5'-bi-2H-isoindole]-2,2'-diyl)-1,4-phenylene]) manufactured by UBE INDUSTRIES, LTD.

On one surface of the base film 1, there are formed wiring patterns 7 via an adhesive layer 6 of, for example, epoxy system having a thickness of 12 $\mu$m (micrometers). The wiring patterns 7 are made, for example, of an electrically conductive foil. Lead terminals of the wiring patterns 7 are exposed at the outer hole 4 on both sides of the tape carrier. The outer hole 4 is used to couple the lead terminal portions of the wiring patterns exposed therein with an external circuit.

At the peripheral portion within the device hole 2, inner leads 9 are exposed. The inner leads 9 are exposed end portions of wiring patterns 7, and are surface treated by, for example, tin (Sn) plating, gold plating, solder plating or the like. Also, a semiconductor device such as an LSI chip and the like not shown in the drawing is mounted in or on the device hole 2. Terminals of the semiconductor device are respectively coupled to the inner leads 9, and a part of the semiconductor device is covered with resin and the like. Thereby a TCP (tape carrier package) is fabricated.

In order to form outer leads 10 for coupling with terminals of an external circuit and the like, portions of the wiring patterns 7 exposed in the outer hole 4 are surface treated by, for example, tin (Sn) plating, gold plating, solder plating or the like. Also, portions of the wiring patterns 7 which exist in a region where the outer hole 4 is not formed but which are to be coupled with an external circuit are surface treated by, for example, tin (Sn) plating, gold plating, solder plating or the like, thereby outer leads 10 is formed.

Further, a solder resist film or layer 8 for protecting the wiring patterns 7 is formed so as to cover the wiring patterns 7 except the portions of the inner leads 9 and the outer leads 10.

In an area of the base film 1 where the base film is bent when the TCP is mounted on, for example, a liquid crystal display device, a bending region with holes or a bending hole region 5 is formed. In the bending hole region 5, a plurality of holes or openings are formed in a mesh like arrangement.

Figure 3:
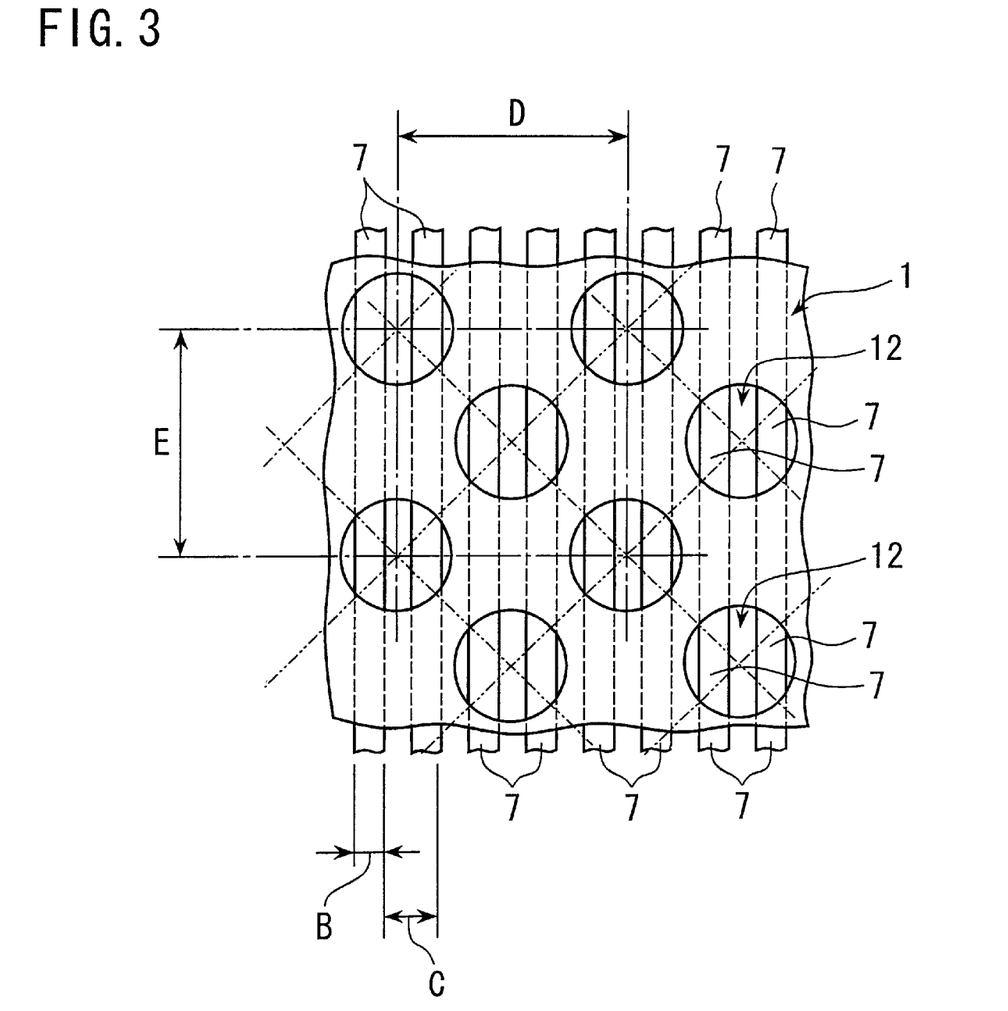
FIG. 3 is a partial cut away plan view illustrating in detail a structure of a bending hole region of the tape carrier shown in FIG. 1 and FIG. 2.

FIG. 3 is a partial cut away plan view of the bending hole region 5 of the tape carrier according to the present embodiment shown in FIG. 1 and FIG. 2. FIG. 3 illustrates holes formed in the bending hole region 5 in detail. In FIG. 3, for sake of simplicity, illustration of the adhesive layer 6 and the solder resist film 8 is omitted.

In the bending hole region 5 of the base film 1, small round shaped holes or openings 12 each having a diameter of, for example, 90–150 $\mu$m are densely formed. In this embodiment, diameter of each of the holes 12 is larger than a space between the wiring patterns 7 in the bending hole region 5, for example, 30 $\mu$m, and the holes 12 have substantially the same diameter. The holes 12 are formed regularly relative to the arrangement of the wiring patterns 7 in the bending hole region 5, and are disposed evenly in the bending hole region 5. For example, the holes 12 are disposed in hound's tooth arrangement.

In the tape carrier of this embodiment, positional relationship between the wiring patterns 7 and the holes 12 is determined, for example, as follows. In the bending hole region 5, the wiring patterns 7 are formed such that width B of each of the wiring patterns 7 becomes, for example, 30 $\mu$m, and pitch C between the wiring patterns 7 becomes, for example, 60 $\mu$m. In such case, the space between the adjacent wiring patterns 7 becomes, for example, 30 $\mu$m. As shown in FIG. 3, the holes 12 are formed such that the centers of the holes 12 are located at grid points and at intersections of diagonal lines connecting the grid points. Here, the grid is an assumed grid or grating structure which does not actually exist on the base film 1 but which is introduced to clearly explain disposition of the holes 12. Such grid structure is composed of two groups of grid lines mutually perpendicular to each other. The grid lines of one group are parallel with the wiring patterns 7, and the grid lines of the other group are perpendicular to the wiring patterns 7. The grid point is an intersection of the grid lines.

The space D between grid lines which are parallel with the wiring patterns 7 is four times the pitch C of the wiring patterns 7, and is 240 $\mu$m. Also, it is preferable that the space E between grid lines which are perpendicular to the wiring patterns 7 is equal to the space D between grid lines which are parallel with the wiring patterns 7. Therefore, in this case, the holes 12 are disposed in hound's tooth like arrangement in the bending hole region 5.

Also, as shown in FIG. 3, the holes 12 are formed such that the center of each hole 12 is located on the center line of the space between the adjacent wiring patterns 7. It is necessary that the holes 12 do not overlap with each other. In this embodiment, if the diameter of each hole is smaller than approximately 170 $\mu$m, the holes 12 do not overlap with each other. However, in order to secure appropriate mechanical strength and the like of the tape carrier, it is preferable that the diameter of the holes 12 is equal to or smaller than 150 $\mu$m.

In this embodiment, the diameter of the hole 12 is larger than the space between the wiring patterns 7, that is, 30 $\mu$m here. Therefore, the wiring patterns 7 are partially exposed in each hole 12. However, as can be seen from FIG. 3, a total area of the portions of each of the wiring patterns 7 which are exposed via the holes 12 is substantially the same for all the wiring patterns 7. That is, it is not possible that the area of exposed portions of a particular wiring pattern 7 becomes much larger or smaller than that of any other wiring pattern 7. Thus, the strength of the respective wiring patterns 7 are substantially the same in the bending hole area 5. That is, it is not possible that mechanical strength of a particular one of the wiring patterns 7 becomes weaker than that of other wiring patterns 7. Therefore, it becomes possible to surely avoid a break of any of the wiring patterns 7 when the TCP is bent. Also, even when the space between adjacent wiring patterns 7 is very small, it is possible to easily and appropriately form the holes 12 in the base film 1. Thus, this structure can be adopted to a tape carrier or a TCP in which wiring patterns are formed on a base film in high density. Also, the holes 12 can be disposed efficiently in high density in the bending hole region 5, so that the proportion of the area of the holes 12 to the area of the bending hole region 5 in the base film 1 can be enlarged. Therefore, it is possible to fold easily and reliably the tape carrier or the TCP in the bending hole region 5.

An explanation will now be made on a manufacturing process of the tape carrier according to this embodiment.

A base film 1 having a tape-like shape is fabricated from a polymer or resin film having high flexibility, for example, a polyimide film having a thickness of 75 $\mu$m such as UPILEX-S (product name) manufactured by UBE INDUSTRIES, LTD. Thereafter, in the base film 1, there are formed a device hole 2, sprocket holes 3, an outer hole 4, and holes 12 disposed in mesh-like arrangement in a bending hole region 5, by, for example, punching which uses metallic die. It is possible to form the holes 12 of the bending hole region 5 in the same process step as that for forming the device hole 2, the sprocket holes 3 and the outer hole 4. Therefore, the holes 12 of the bending hole region 5 can be formed without using additional step or steps in a manufacturing process of the tape carrier. Thus, it is possible to avoid an increase in a manufacturing cost and to avoid deterioration of throughput in the manufacturing of the tape carrier.

The holes 12 in the bending hole region 5 are formed regularly relative to the arrangement of the wiring patterns 7 which are formed later, and are disposed evenly in the bending hole region 5. For example, the holes 12 are disposed such that the centers of the holes 12 are located at the grid points and at intersections of diagonal lines connecting the grid points. The space D between grid lines which are parallel with the wiring patterns 7 and the space E between grid lines which are perpendicular to the wiring patterns 7 are both, for example, 240 $\mu$m. The diameter of each hole 12 is, for example, 90–150 $\mu$m.

Onto one of the surfaces of the base film 1, for example, an electrically conductive metal foil is bonded via an adhesive layer 6 of epoxy system having a thickness of, for example, 12 $\mu$m. Thereafter, the bonded metal foil is selectively removed by etching to form wiring patterns 7. The width B of each of the wiring patterns 7 is, for example, 30 $\mu$m, and the pitch C between the wiring patterns 7 is, for example, 60 $\mu$m. It is preferable that the center of each hole 12 is located on the center line of the space between adjacent wiring patterns 7.

Thereafter, a solder resist layer 8 for protecting the wiring patterns 7 is formed to cover the wiring patterns 7, except the portions of inner leads 9 and outer leads 10. Further, the inner leads 9 and the outer leads 10 are surface treated by, for example, tin (Sn) plating, gold plating, solder plating or the like. Thereby, the tape carrier according to the present embodiment is fabricated.

Then, a semiconductor chip or semiconductor device is mounted on the portion of the device hole 2 and terminals of the semiconductor chip are coupled with the inner leads 9 projected and exposed at the device hole 2, and the semiconductor chip is covered with resin and the like. Thereby a TCP is fabricated. The fabricated TCP is used, for example, in a liquid crystal display device. In such case, the outer leads 10 of the TCP are coupled with wiring terminals of the liquid crystal display panel, and the TCP is disposed in the liquid crystal display device in condition the TCP is bent at the bending hole region 5.

In the tape carrier according to this embodiment, in the bending hole region 5 of the base film 1, there are formed small holes 12 each having a round shape but not a slit like shape. Also, the holes 12 are disposed regularly and evenly, that is, in a mesh like arrangement, in the bending hole region 5. Therefore, when the tape carrier or the TCP is bent or when any stress is applied thereto from external, the stress does not concentrate in particular portion or portions. Thus, it is possible to avoid damage of the base film 1, and to substantially secure mechanical strength of the base film 1 without deteriorating bending characteristics.

As a result of such constitution, it is not necessary to enlarge a thickness of the base film 1 of the tape carrier or TCP to secure mechanical strength, and it is possible to dispose the TCP within a very narrow space. Therefore, the size of the liquid crystal display device can be decreased. Also, since the size of the TCP in the direction of the thickness can be reduced, it is possible to reduce the size and weight of the TCP.

As mentioned above, since a stress does not concentrate partially in the bending hold region 5, it is possible to surely avoid disconnection of the wiring patterns 7. Also, it is not necessary to apply a protective resin film for reinforcement of the wiring patterns and the like or to bond a reinforcement film like the conventional technology. Further, the holes 12 can be formed in the bending hole area 5 in a mesh like arrangement, without using additional process steps in a manufacturing process of the tape carrier. Thus, it is possible to provide a reliable tape carrier or TCP by using a simple structure and a simple manufacturing process. That is, it is possible to manufacture a tape carrier or TCP which has sufficient mechanical strength and which can be easily and appropriately bent in predetermined bending area or areas, at low manufacturing cost and with high throughput.

Since each of the holes 12 formed in the bending hole region 5 has a round shape, it is possible to distribute easily and efficiently the stress applied to the bending hole region 5. Thus, it is possible to avoid easily and surely damage of the base film 1 and break of the wiring patterns 7 caused by the concentration of the stress.

The holes 12 formed in the bending hole region 5 are disposed in hound's tooth arrangement. Therefore, the mechanical strength of the tape carrier at the bending hole region 5 is approximately uniform, and it is not possible that mechanical strength of particular portion or portions of the wiring patterns 7 becomes relatively weak. Thus, it is possible to efficiently secure mechanical strength of the tape carrier or the TCP, and to surely avoid disconnection of the wiring patterns 7. Also, even when the space between adjacent wiring patterns 7 is very small, it is possible to easily and appropriately form the holes 12 in the base film 1. Thus, this structure can be appropriately adopted to a tape carrier or a TCP in which wiring patterns are formed on a base film in very high density. Also, the holes 12 can be disposed efficiently in high density in the bending hole region 5, so that the proportion of the area of the holes 12 to the area of the bending hole region 5 in the base film 1 can be enlarged. Therefore, it is possible to bend easily and reliably the tape carrier or the TCP in the bending hole region 5.

Also, according to the present invention, it is possible to provide a liquid crystal display device using the TCP which has the merits mentioned above. Therefore, it is possible to enhance reliability of the liquid crystal display device, to decrease the size of the liquid crystal display device and to reduce manufacturing cost of the liquid crystal display device.

In the above-mentioned embodiment, the holes 12 each having a round shape are formed in the bending hole region 5 in a mesh like arrangement. In such case, the diameter of each hole 12 is not limited to 90–150 μm, but can be other diameter. That is, the diameter can be smaller than 90 μm or can be larger than 150 μm. Also, the shape of each hole 12 may also be any shape other than a circle, for example, may be a polygon such as a triangle, a quadrangle and the like, or an ellipse.

Further, in the above-mentioned embodiment, the holes 12 in the bending hole region 5 are formed such that the centers of the holes 12 are located at the grid points and at intersections of diagonal lines connecting the grid points. That is, the holes 12 are disposed in a hound's tooth arrangement. However, the present invention is not limited to disposing the holes 12 in such hound's tooth arrangement, but it is possible to use other arrangement as long as the good bending characteristics are obtained and sufficient mechanical strength is secured.

The base film 1 can be formed by using any material other than polyimide, as long as the required flexibility and mechanical strength are obtained.

In the above, description is made mainly on the TCP. However, the present invention can also be applied to a tape automated bonding (TAB) and the like. Also, according to the present invention, similar advantageous effects can be obtained in a tape carrier and TCP which are used in an apparatus other than the liquid crystal display device, as well as a tape carrier and TCP which are used in the liquid crystal display device.

The device hole 2, the sprocket holes 3, the outer hole 4, and the holes 12 disposed in mesh like arrangement of the bending hole region 5 can be formed in the base film 1 by using a method other than the punching which uses metallic die, for example, by using etching and the like. In case the etching is used, the holes 12 in the bending hole region 5 can be formed in the same process as the process for forming the device hole 2, the sprocket holes 3 and the outer hole 4.

In summary, according to the present invention, in the bending region of the base film, there are formed small holes each having a round shape but not a slit like shape. Also, the round holes are disposed regularly and evenly, that is, in a mesh like arrangement, in the bending region. Therefore, when the tape carrier or the TCP is bent or when any stress is applied thereto from external, the stress does not concentrate in particular portion or portions. Thus, it is possible to avoid damage of the base film, and to substantially secure mechanical strength of the base film without deteriorating bending characteristics.

Also, since stress do not concentrate partially in the bending region, it is possible to surely avoid disconnection or break and the like of the wiring patterns. Also, it is not necessary to apply a protective resin film for reinforcement of the wiring patterns and the like or to bond a reinforcement film like the conventional technology. Further, the holes can be formed in the bending area in a mesh like arrangement, without using additional process steps in a manufacturing process of the tape carrier. Thus, it is possible to provide a reliable tape carrier or TCP by using a simple structure and a simple manufacturing process. That is, it is possible to manufacture a tape carrier or TCP which has sufficient mechanical strength and which can be easily and appropriately bent in predetermined bending area or areas, at low manufacturing cost and with high throughput.

Since each of the holes 12 formed in the bending region has a round shape, it is possible to distribute easily and efficiently stress or stresses applied to the bending hole region. Thus, it is possible to easily and surely avoid damage of the base film and break of the wiring patterns caused by the concentration of the stress or stresses.

The holes for bending the tape carrier formed in the bending region are disposed in hound's tooth arrangement. Therefore, the mechanical strength of the tape carrier at the bending region is approximately uniform, and it is not possible that mechanical strength of particular portion or portions of the wiring patterns becomes relatively weak. Thus, it is possible to efficiently secure mechanical strength of the tape carrier or the TCP, and to surely avoid break and the like of the wiring patterns. Also, even when the space between adjacent wiring patterns is very small, it is possible to easily and appropriately form the holes for bending the base film therein. Thus, this structure can be adopted to a tape carrier or a TCP in which wiring patterns are formed on a base film in high density. Also, the holes can be disposed efficiently in high density in the bending region, so that the proportion of the area of the holes to the area of the bending region in the base film can be enlarged. Therefore, it is possible to fold easily and reliably the tape carrier or the TCP in predetermined bending region or regions.

Also, according to the present invention, it is possible to provide a liquid crystal display device using the TCP which has the merits mentioned above. Therefore, it is possible to enhance reliability of the liquid crystal display device, to decrease the size of the liquid crystal display device and to reduce manufacturing cost of the liquid crystal display device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A tape carrier comprising:
   a base film made of an insulating material;
   wiring patterns formed on said base film, each of said wiring patterns being adjacent to each other, each of said wiring patterns having a width, each of said adjacent wiring patterns being separated by a space therebetween, the width of each wiring pattern and the space therebetween forming a pitch; and
   a bending area of said base film in which a plurality of holes are formed regularly, the width of each of said holes in the direction perpendicular to said wiring patterns being larger than the pitch of each wiring pattern plus the width of an adjacent wiring pattern in said bending area.

2. A tape carrier as set forth in claim 1, wherein each of said plurality of holes has a round shape.

3. A tape carrier as set forth in claim 1, wherein said holes are formed such that the centers of said holes are located at grid points of an assumed grid structure which is composed of lines parallel with said wiring patterns and lines perpendicular to said wiring patterns and at the intersections of diagonal lines connecting said grid points.

4. A tape carrier as set forth in claim 3, wherein the distance between adjacent grid points is four times a pitch of said wiring patterns in said bending area.

5. A tape carrier as set forth in claim 4, wherein the center of each of said plurality of holes is located on the center line of a space between adjacent wiring patterns in said bending area.

6. A tape carrier package comprising:

a base film made of an insulating material;

wiring patterns formed on said base film, each of said wiring patterns being adjacent to each other, each of said wiring patterns having a width, each of said adjacent wiring patterns being separated by a space therebetween, the width of each wiring pattern and the space therebetween forming a pitch;

at least one semiconductor device each mounted on or in a device hole formed at said base film; and a bending area of said base film in which a plurality of holes are formed regularly, the width of each of said holes in the direction perpendicular to said wiring patterns being larger than the pitch of each wiring pattern plus the width of an adjacent wiring pattern in said bending area.

7. A tape carrier package as set forth in claim 6, wherein each of said plurality of holes has a round shape.

8. A tape carrier package as set forth in claim 6, wherein said holes are formed such that the centers of said holes are located at grid points of an assumed grid structure which is composed of lines parallel with said wiring patterns and lines perpendicular to said wiring patterns and at the intersections of diagonal lines connecting said grid points.

9. A tape carrier package as set forth in claim 8, wherein the distance between adjacent grid points is four times a pitch of said wiring patterns in said bending area.

10. A tape carrier package as set forth in claim 9, wherein the center of each of said plurality of holes is located on the center line of a space between adjacent wiring patterns in said bending area.

11. A liquid crystal display device comprising a tape carrier package as set forth in claim 6.

12. A method of manufacturing a tape carrier, said method comprising:

preparing a base film made of an insulating material;

forming a plurality of holes regularly in a bending area of said base film; and forming wiring patterns on a surface of said base film, each of said wiring patterns being adjacent to each other, each of said wiring patterns having a width, each of said adjacent wiring patterns being separated by a space therebetween, the width of each wiring pattern and the space therebetween forming a pitch;

the width of each of said holes in the direction perpendicular to said wiring patterns being larger than the pitch of each wiring pattern plus the width of an adjacent wiring pattern in said bending area.

13. A method of manufacturing a tape carrier as set forth in claim 12, further comprising: forming sprocket holes and at least one device holes each for mounting a semiconductor device therein or thereon in said base film.

14. A method of manufacturing a tape carrier as set forth in claim 13, wherein said forming a plurality of holes regularly in a bending area of said base film and said forming sprocket holes and at least one device holes each for mounting a semiconductor device therein or thereon in said base film are performed in substantially the same process step.

15. A method of manufacturing a tape carrier as set forth in claim 12, wherein in said forming a plurality of holes regularly in a bending area of said base film, said holes are formed by punching which uses metallic die.

16. A method of manufacturing a tape carrier as set forth in claim 12, wherein in said forming a plurality of holes regularly in a bending area of said base film, said holes are formed by etching.

17. A method of manufacturing a tape carrier as set forth in claim 12, wherein each of said plurality of holes has a round shape.

18. A method of manufacturing a tape carrier as set forth in claim 12, wherein said holes are formed such that the centers of said holes are located at grid points of an assumed grid structure which is composed of lines parallel with said wiring patterns and lines perpendicular to said wiring patterns and at the intersections of diagonal lines connecting said grid points.

19. A method of manufacturing a tape carrier as set forth in claim 12, wherein the distance between adjacent grid points is four times a pitch of said wiring patterns in said bending area.

20. A method of manufacturing a tape carrier as set forth in claim 12, wherein the center of each of said plurality of holes is located on the center line of a space between adjacent wiring patterns in said bending area.

* * * * *